(12) United States Patent
Gong

(10) Patent No.: US 6,539,515 B1
(45) Date of Patent: Mar. 25, 2003

(54) ACCELERATED REED-SOLOMON ERROR CORRECTION

(75) Inventor: Jian Gong, Mountain View, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/449,230

(22) Filed: Nov. 24, 1999

(51) Int. Cl.[7] .............................................. H03M 13/00
(52) U.S. Cl. ...................................... 714/784; 714/781
(58) Field of Search .............................. 714/784, 781, 714/752, 758, 785, 786

(56) References Cited

U.S. PATENT DOCUMENTS

| | | | |
|---|---|---|---|
| 4,868,828 A | | 9/1989 | Shao ........................... 371/5.1 |
| 4,873,688 A | * | 10/1989 | Maki et al. ................... 714/784 |
| 5,099,482 A | * | 3/1992 | Cameron ...................... 714/784 |
| 5,912,905 A | * | 6/1999 | Sakai et al. .................. 714/784 |
| 6,449,746 B1 | * | 9/2002 | Truong et al. ............... 714/784 |

OTHER PUBLICATIONS

"On-the-Fly Decoder for Multiple Byte Errors", by Arvind M. Patel, IBM J. of Res Develop, vol. 30, No. 3, May 1986, pp. 259–268.

"Design and Implementation of FEC Codecs Using Reed–Solomon Codes", J. Instn. Electronics & Telecom. Engrs., vol. 35, No. 6 1989, pp. 322–330.

* cited by examiner

Primary Examiner—Christine T. Tu
(74) Attorney, Agent, or Firm—John Vodopia

(57) ABSTRACT

A Reed-Solomon (R-S) decoder is presented that simultaneously searches for m roots of the error locator polynomial and the error magnitude polynomial. A polynomial evaluator includes a plurality of slice elements corresponding to each term of the polynomial. Each slice element includes a plurality of coefficient multipliers that are configured to evaluate the term for different values, thereby effecting a simultaneous evaluation of the polynomial at each of these different values. In a preferred embodiment, only one register is required in each slice element for receiving the coefficients of the polynomial and for facilitating an iterative evaluation of the polynomial for other values. In a preferred embodiment, two polynomial evaluators are employed for decoding a Reed-Solomon codeword. One evaluator is used to provide a modified form of the Chien error locator algorithm, and the other is used to provide a modified form of the Forney error determination algorithm.

14 Claims, 4 Drawing Sheets

ACCELERATED REED-SOLOMON ERROR CORRECTION

BACKGROUND OF THE INVENTION

1. Field of the Invention

This invention relates to the field of communication and data storage systems, and in particular to the decoding of communications that contain block-based error correction codes.

2. Description of Related Art

One of the parameters used to specify the quality of a digital communication system is the "Bit Error Ratio", or BER. The BER specifies the probability that an erroneous bit is produced at the output of the receiving system. Specifications for storage devices (tapes, disk, CD, DVD, barcode), mobile communications (cellular telephone, microwave links), satellite communications, digital television, and the like, often require BERs in the order of $10^{-9}$ or less. One technique for providing a low probability of error is to transmit the information using a high powered transmitter to achieve a high signal to noise ratio (SNR). This is often impractical or costly, particularly for mobile systems that use batteries to supply the transmit power, and broadcast systems that must conform to interference standards, such as published by the FCC.

An alternative method of achieving a high BER without relying on a high SNR is to encode the information with an error correcting code, so that when an error occurs during a transmission, it can be corrected by the receiver, and therefore will no longer be an "error". Error correcting techniques are commonly available for automatically correcting multiple errors within a transmission.

A commonly used error correcting technique is a Reed-Solomon error correcting code. Using Reed-Solomon (R-S) terminology, fixed-length (n) codewords are transmitted, each codeword comprising k information symbols and n–k appended error correcting parity symbols. Each symbol comprises s bits. A R-S decoder can correct up to (n–k)/2 symbols that contain errors in a codeword. Because each of these correctable symbols may contain multiple bit-errors, the R-S encoding technique is particularly well suited for burst errors that affect multiple contiguous bits. A common R-S encoding scheme uses a codeword of 255 eight-bit symbols, 223 of which are information symbols, and the remaining 32 symbols are error correcting parity symbols. This encoding scheme will correct up to 16 erroneous symbols in every 255 codeword, thereby providing a substantial improvement in Bit Error Rate.

The R-S encoding scheme will also detect "erasures", which are errors at known locations, and require less information to correct. The number of errors plus twice the number of erasures that an R-S decoder can correct is (n–k)/2. For ease of reference, the term "error" is used hereinafter to refer to either an error of unknown location or an erasure of known location.

FIG. 1 illustrates an example block diagram of a prior art R-S decoder 100. The decoder 100 receives each codeword r(x) 101, and produces a corrected codeword c(x) 151. A syndrome calculator 110 processes the codeword 101 to produce corresponding syndrome polynomials Si(x) 111. Each codeword has n–k syndromes that depend only on errors, and not on the transmitted codeword. From these syndromes 111, an error locator polynomial Λ(x) 121 is produced. Euclid's algorithm 120 is illustrated for providing the error locator polynomial 121, and an error magnitude polynomial Ω(x) 122, although other techniques, such as the Berlekamp-Massey algorithm can be used as well. Each R-S code has a parameter a that is the primitive element of a Galois Field (GF) that is chosen for the R-S code. The error locator polynomial is structured such that if an error occurs at position p, $a^{-p}$ will be a root of the error polynomial (p is indexed from 0 to n–1).

An iterative approach is conventionally applied to test each value of $a^{-p}$ for each position p in the codeword, to determine if $a^{-p}$ is a root, $X_k^{-1}$, of the error locator polynomial 121. A commonly used algorithm for this iterative test is the Chien error locator 130. The Chien locator 130 also provides a related error differential term, $X_k^{-1}\Lambda'(X_k^{-1})$ 132, that facilitates a determination of the magnitude 141 of the error, typically via the Forney error determination algorithm, as illustrated at block 140. The error determinator 140 evaluates the error magnitude polynomial 122 corresponding to the located error symbol. For each error that the error locator 130 locates, an error corrector 150 determines the corrected codeword c(x) 151, based on the location 131 and magnitude 141 of this error. If an error is not detected for a given symbol, the symbol in the corrected codeword c(x) 151 at this evaluated position is equal to the symbol in the received codeword r(x) 101.

FIG. 2 illustrates an example block diagram of a prior art Chien error locator 130. The error locator 130 includes a plurality of polynomial term evaluators 220. Each evaluator 220 includes a register 221 and a coefficient multiplier 225. The set of registers 221 receive the coefficients λ of the error locator polynomial Λ(x) 121, and the set of coefficient multipliers 225 multiply the coefficients λ by corresponding powers of a 222 and store the resultant product terms into the registers 221. With regard to the output polynomial value 231, the adders 230a, 230b, and 230c form a single adder that combines the product terms of each coefficient multiplier 225. That is, initially the adders provide the sum of the coefficients λ, corresponding to an evaluation of the error locator polynomial Λ(x) 121 at $a^0$ (i.e. value=$\lambda_{n-1}(a^0)^{n-1}$+$\lambda_{n-2}(a^0)^{n-2}$+ . . . +$\lambda_2(a^0)^2$+$\lambda_1(a^0)^1$+$(a^0)^0\lambda_0$). If this value 231 is zero, $a^0$ is a root, indicating that an error is present at position 0. In like manner, after multiplying the powers of a 222 with the corresponding coefficients λ of the error locator polynomial Λ(x) 121, the polynomial value 231 is the evaluation of the error locator polynomial Λ(x) 121 at $a^{-1}$ (i.e. value=$\lambda_{n-1}(a^{-1})^{n-1}$+$\lambda_{n-2}$+ . . . +$\lambda_2(a^{-1})^2$+$\lambda_1(a^{-1})^1$+$(a^{-1})^0\lambda_0$). If this value 231 is zero, $a^{-1}$ is a root, indicating that an error is present at position 1. At the next cycle, the contents of the registers 221 are again multiplied by powers of a 222. This results in a squaring of each power of a 222, and the polynomial value 231 corresponds to the evaluation of the error locator polynomial at $a^{-2}$ (i.e. value=$\lambda_{n-1}(a^{-2})^{n-1}$+$\lambda_{n-2}(a^{-2})^{n-2}$+ . . . +$\lambda_2(a^{-2})^2$+$\lambda_1(a^{-2})^1$+$\lambda_0(a^{-2})^0$). If this value 231 is zero, $a^{-2}$ is a root, indicating that an error is present at position 2. The next cycles correspond to an evaluation of the polynomial at $a^{-3}$, then $a^{-4}$, then $a^{-5}$, and so on. The iterative process continues until all n symbol positions (0 to n–1) are evaluated. As noted above, the conventional Chien locator 130 also provides a derivative term $X_k^{-1}\Lambda'(X_k^{-1})$ 132 that facilitates the determination of the error magnitude 141 in the error determinator 140 corresponding to a located root $X_k^{-1}$ of the locator polynomial Λ(x). The derivative term 132 is illustrated in FIG. 2 as a partial sum of the even polynomial terms; alternatively, the odd terms can be used.

To reduce the time required to evaluate all n symbols of an error correcting codeword, redundant parallel embodiments of the iterative components can be considered. That is, in principle, if two copies of the error locator 130 and error determinator 140 are provided, the odd powers of a could be evaluated by one set of locator/determinators, and the even powers of a evaluated in the other. Alternatively, one set of locator/determinators could be used to process the first half of symbols, while the other set of locator/determinators is used to process the other half, thereby facilitating the single multiplication of the powers of a 222 per cycle as in the conventional prior art device. However, the registers 221 of the set of locator/deteminators used for the "second" half of the symbols would need to be initialized to the appropriate powers of a 222 times the λ terms, which would require additional components. Each redundant set, however, requires a corresponding direct linear increase in area (two sets=twice the area; three sets=3×the area; etc.), plus any additional circuitry required to effect the partitioning of the process.

BRIEF SUMMARY OF THE INVENTION

It is an object of this invention to reduce the time required to evaluate all n symbols of an error correcting codeword. It is a further object of this invention is reduce the number of components required to evaluate all n symbols of an error correcting codeword, as compared to a redundant embodiment of prior art components.

These objects and others are achieved by providing a polynomial evaluator that includes a plurality of slice elements corresponding to each term of the polynomial. Each slice element includes a plurality of coefficient multipliers that are configured to evaluate the term for different values, thereby effecting a simultaneous evaluation of the polynomial at each of these different values. In a preferred embodiment, only one register is required in each slice element for receiving the coefficients of the polynomial and for facilitating an iterative evaluation of the polynomial for other values. In a preferred embodiment, two polynomial evaluators are employed for decoding a Reed-Solomon codeword. One evaluator embodies a modified form of the Chien error locator algorithm, and the other embodies a modified form of the Forney error determination algorithm.

BRIEF DESCRIPTION OF THE DRAWINGS

The invention is explained in further detail, and by way of example, with reference to the accompanying drawings wherein.

Throughout the drawings, the same reference numerals indicate similar or corresponding features or functions.

DETAILED DESCRIPTION OF THE INVENTION

A Reed Solomon (R-S) decoder is presented herein as a paradigm for an error correcting decoder that utilizes an iterative polynomial evaluation to determine whether particular values are roots of the given polynomial. It will be evident to one of ordinary skill in the art that the techniques presented herein are equally applicable to other decoding techniques that employ similar polynomial evaluation processes.

Figure 3:
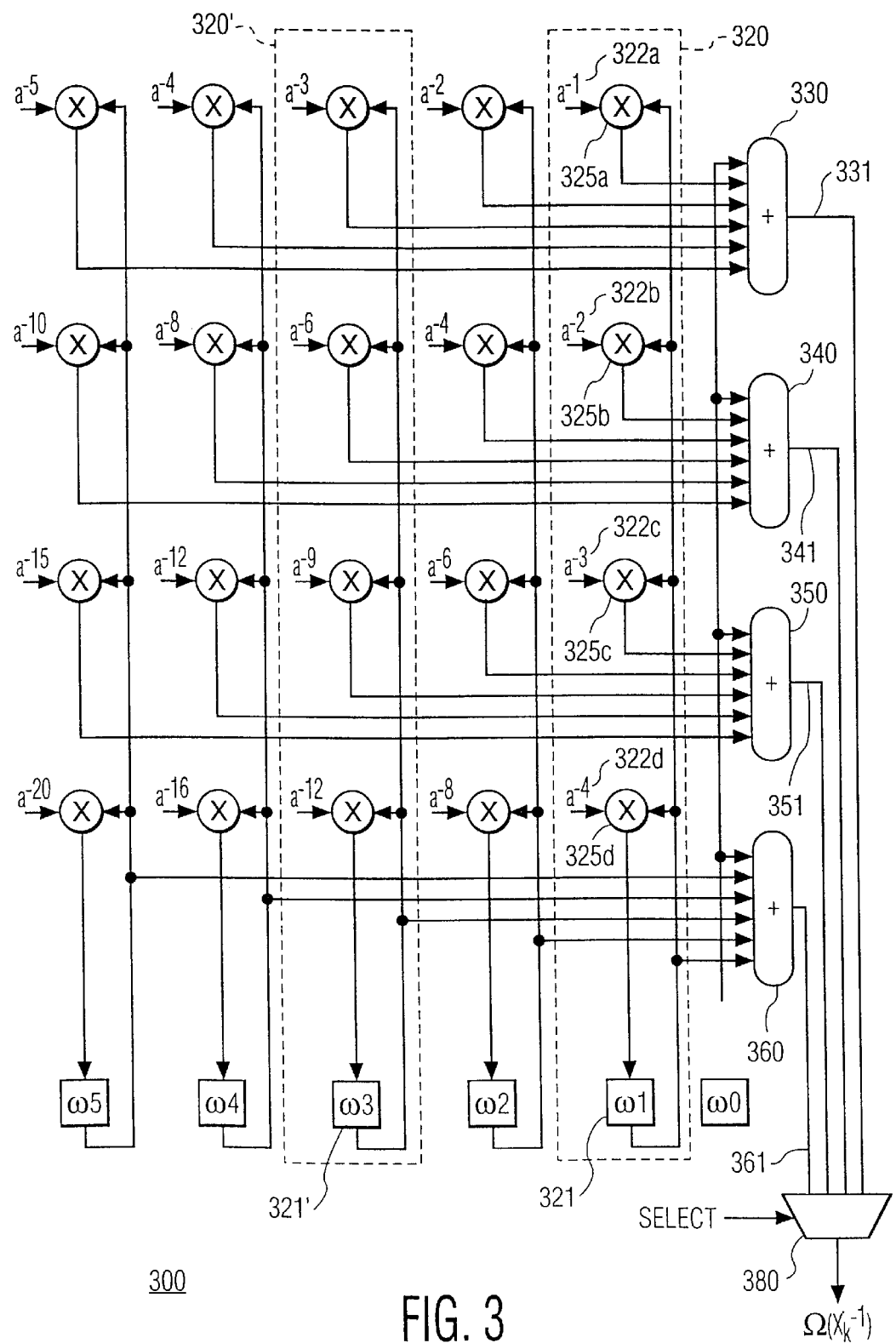
FIG. 3 illustrates an example block diagram of a multi-value polynomial evaluator in accordance with this invention.

FIG. 3 illustrates an example block diagram of a multi-value polynomial evaluator 300 in accordance with this invention. The evaluator 300 includes a slice element 320 corresponding to each non-constant term of the polynomial being evaluated. Each slice element 320 includes a plurality of coefficient multipliers 325. FIG. 3 illustrates four multipliers 325a–d, although any number of multipliers may be provided. Each slice element 320 includes a register 321 that initially receives the coefficient ω of the term of the polynomial associated with the slice element 320. Each multiplier 325a–d multiplies the contents of the register 321 with an associated power of a 322a–d to simultaneously produce an evaluation of the associated term of the polynomial for multiple powers of a. That is, for example, the outlined slice element 320 provides an evaluation of the first degree term of the polynomial for values corresponding to argument values of $a^{-1}$, $a^{-2}$, $a^{-3}$, and $a^0$. Note that the inputs to the adder 360 are from the corresponding register elements 321, before the coefficient multiplier 325d, whereas the inputs to the other adders 330, 340, and 350 are from the coefficient multipliers 325a–c, thus accounting for the $a^0$ term, in lieu of $a^{-4}$. The adjacent slice elements provide an evaluation of their associated higher order terms of the polynomial for these same argument values $a^{-1}$, $a^{-2}$, $a^{-3}$, and $a^0$. This is effected by providing powers of a to each subsequent slice element that correspond to the square, cube, etc. of the powers of a used in the first degree slice element 320. That is, for example, the outlined slice element 320' corresponds to the cubed term of the polynomial, and the coefficient multipliers provide outputs corresponding to $\omega_3(a^{-1})^3$, $\omega_3(a^{-2})^3$, $\omega_3(a^{-3})^3$, and $\omega_3(a^0)^3$. An adder 330 sums the product terms produced by the first coefficient multiplier 325a in each slice element 320 to provide the resultant value 331 of the polynomial for the argument value of $a^{-1}$. The adder 340 provides the resultant value 341 of the polynomial for the argument value of $a^{-2}$; the adder 350 provides the value 351 corresponding to $a^{-3}$; and the adder 360 provides the value 361 corresponding to $a^0$. Note that the product term from the multiplier 325d forms the input to the register 321, so the polynomial value corresponding to $a^{-4}$ is provided to the adder 360 on the next cycle.

Thus, as illustrated in FIG. 3, the polynomial evaluator 300 provides an evaluation of a given polynomial for four different powers of a, simultaneously, thereby effecting a four-fold improvement in speed as compared to a conventional single-value polynomial evaluator. As compared to a replication of four single-value polynomial evaluators, only one set of coefficient registers 321 is required, thereby saving the cost and area associated with redundant registers and their associated routing paths.

In accordance with another aspect of this invention, the register 321 of each slice element receives the product of the highest order power of a (in this case, $a^{-4}$) and the prior contents of the register 321. In the example of FIG. 3, the register 321 receives the product of its prior contents ($\omega_1$) and $a^{-4}$. In this way, the next cycle of multiplications will be an evaluation of the polynomial for the values of $a^{-5}$, $a^{-6}$, $a^{-7}$, and $a^{-4}$ ($a^{-1}*\omega_1 a^{-4}$, $a^{-2}*\omega_1 a^{-4}$, $a^{-3}*\omega_1 a^{-4}$, and $\omega_1 a^{-4}$, respectively, in the outlined slice element 320). In like manner, the register 321' of the outlined slice element 320' will contain the value $\omega_3 a^{-12}$, and the multiplications will be an evaluation of the cubed term of the polynomial for the argument values of $a^{-5}$, $a^{-6}$, $a^{-7}$, and $a^{-4}$ (providing product terms: $a^{-3}*\omega_3 a^{-12}$, $a^{-6}*\omega_3 a^{-12}$, $a^{-9}*\omega_3 a^{-12}$, and $\omega_3 a^{-12}$, which equal $\omega_3(a^{-5})^3$, $\omega_3(a^{-6})^3$, $\omega_3(a^{-7})^3$, and $\omega_3(a^{-4})^3$, respectively). In this manner, the polynomial evaluator 300 will iteratively evaluate the given polynomial for successive powers of a, four at a time.

Illustrated in FIG. 3 is an optional selector 380 that allows for the selection of each of the evaluations 331, 341, 351, 361 of the polynomial, as required. This selector 380 allows the multiple-value polynomial evaluator 300 to interface with single value processing systems by providing the evaluations 331, 341, 351, 361 sequentially for processing. If the subsequent processing device includes the ability to receive the four evaluations simultaneously, the selector 380 is not required.

Figure 2:
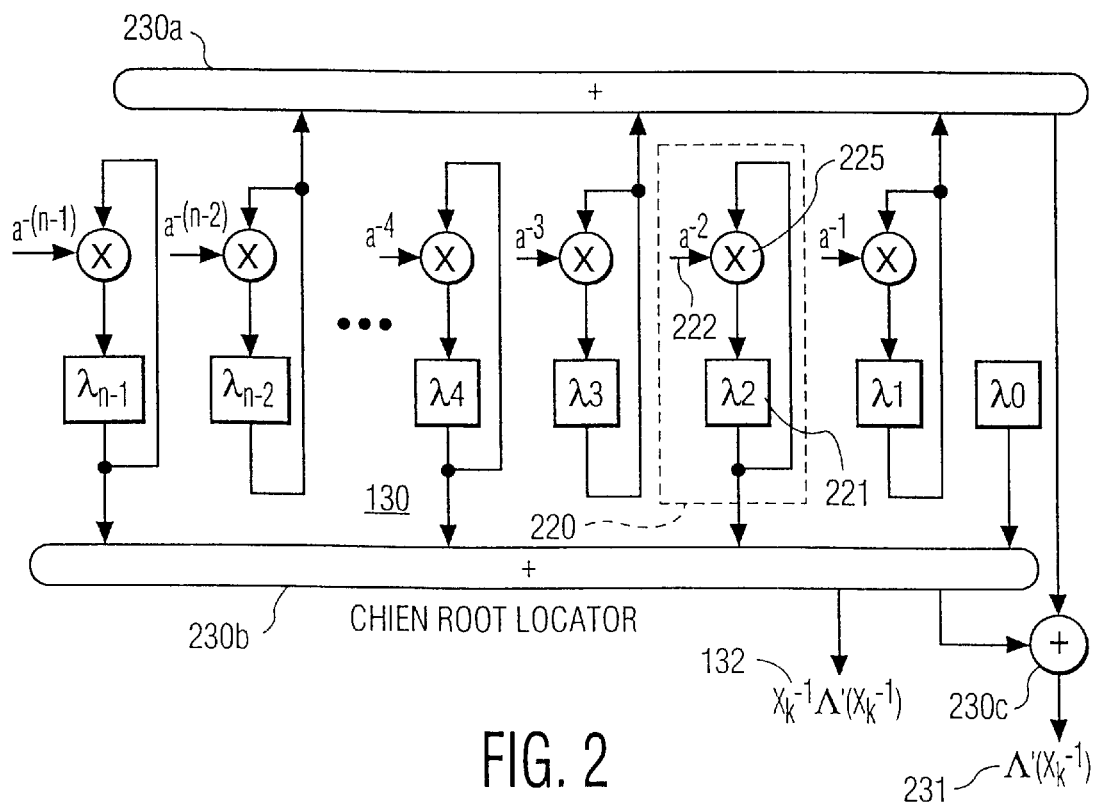
FIG. 2 illustrates an example block diagram of a prior art error locator.
Figure 4:
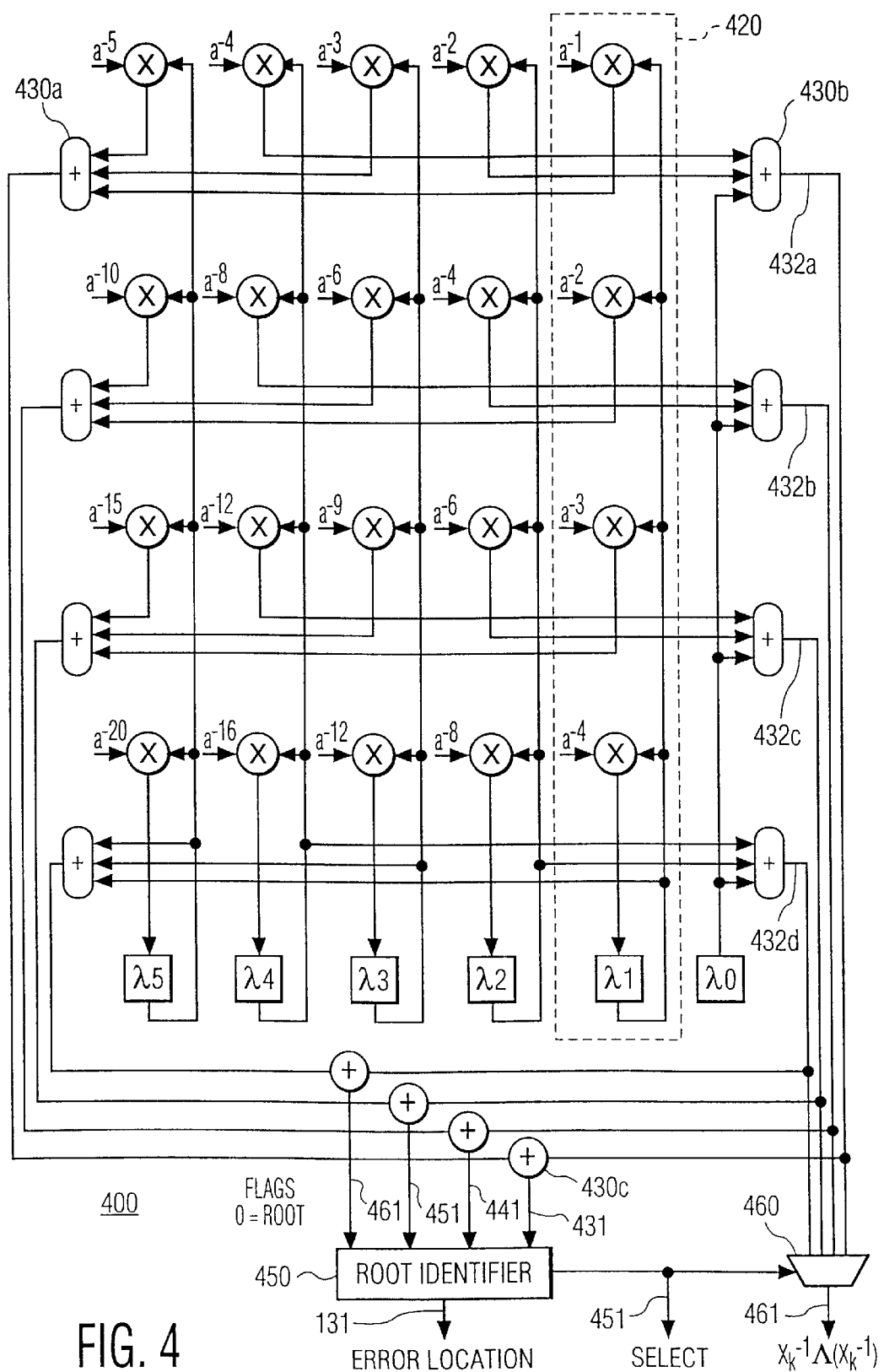
FIG. 4 illustrates an example block diagram of a modified form of a Chien error locator in accordance with this invention.

FIG. 4 illustrates an example block diagram of a multi-value polynomial evaluator that provides a modified form of a Chien error locator 400 in accordance with this invention. The principle of operation of the error locator 400 is based on the principles presented above with regard to the Chien error locator 200 of FIG. 2 and the multi-value polynomial evaluator 300 of FIG. 3. The locator 400 includes a plurality of slice elements 420 that operate similar to the slice elements 320 of FIG. 3. As compared to the slice elements 320, however, the addition operation provided by the single adder 330 is partitioned into sub-adders 430a, 430b, and 430c. This partitioning allows the sub-adder 430b to provide the derivative term 432 that facilitates the determination of an error magnitude corresponding to each error location. The output of the final sub-adder 430c corresponds to the evaluation of the polynomial for an argument that is a given power of a. In the example of FIG. 4, sub-adder 430c provides an evaluation 431 of the polynomial for the arguments $a^{-1}$, $a^{-5}$, $a^{-9}$, and so on. In like manner, sum 441 corresponds to an evaluation of the polynomial for $a^{-2}$, $a^{-6}$, $a^{-10}$, etc.; sum 451 corresponds to an evaluation for $a^{-3}$, $a^{-7}$, $a^{-11}$, etc.; and sum 461 corresponds to an evaluation for $a^0$, $a^{-4}$, $a^{-8}$, $a^{-12}$, etc. As in the prior art Chien locator 200, an error at position p is detected if the evaluation of the error locator polynomial $\Lambda(a^{-p})$ is zero. Thus, in accordance with this aspect of the invention, locator 400 will simultaneously identify the location of up to four errors in a received codeword and will simultaneously provide corresponding derivative terms $X_k^{-1}\Lambda'(X_k^{-1})$ 432a–d that facilitate the determination of the magnitude of the error at each located root $X_k^{-1}$.

As in the polynomial evaluator 300, the locator 400 may include an optional selector 460 that allows the selection of the individual terms 432 for subsequent processing by a single-value processor. A root identifier block 450 is configured to provide a select signal 451 corresponding to each located error (each polynomial evaluation that is equal to zero).

Figure 1:
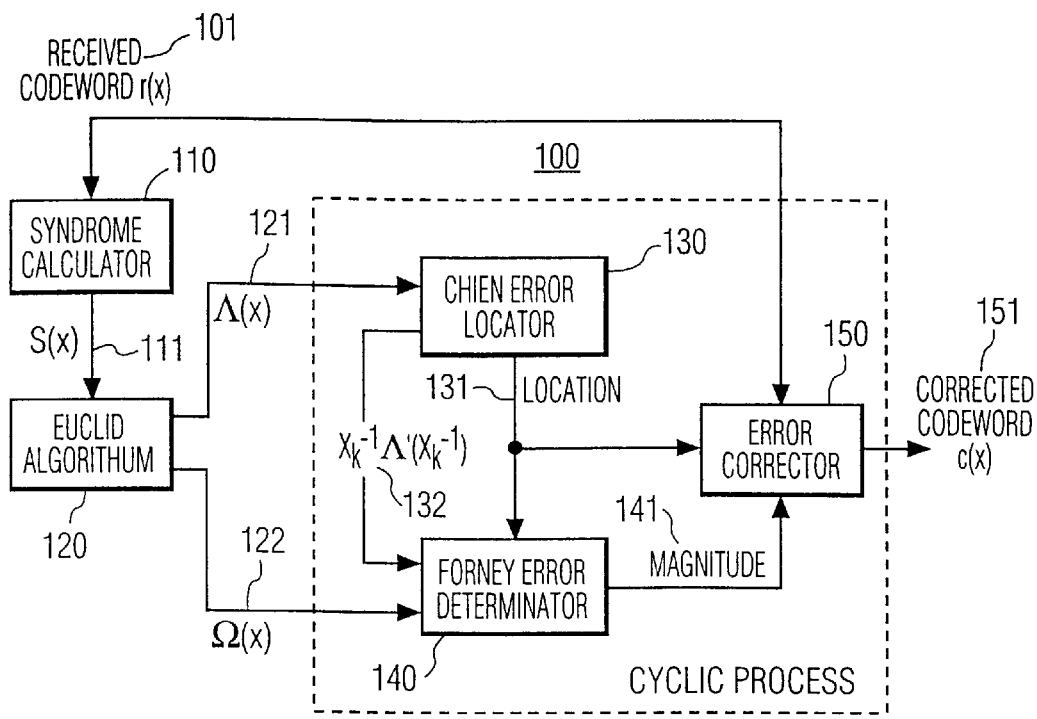
FIG. 1 illustrates an example block diagram of a prior art error correcting decoder.
Figure 5:
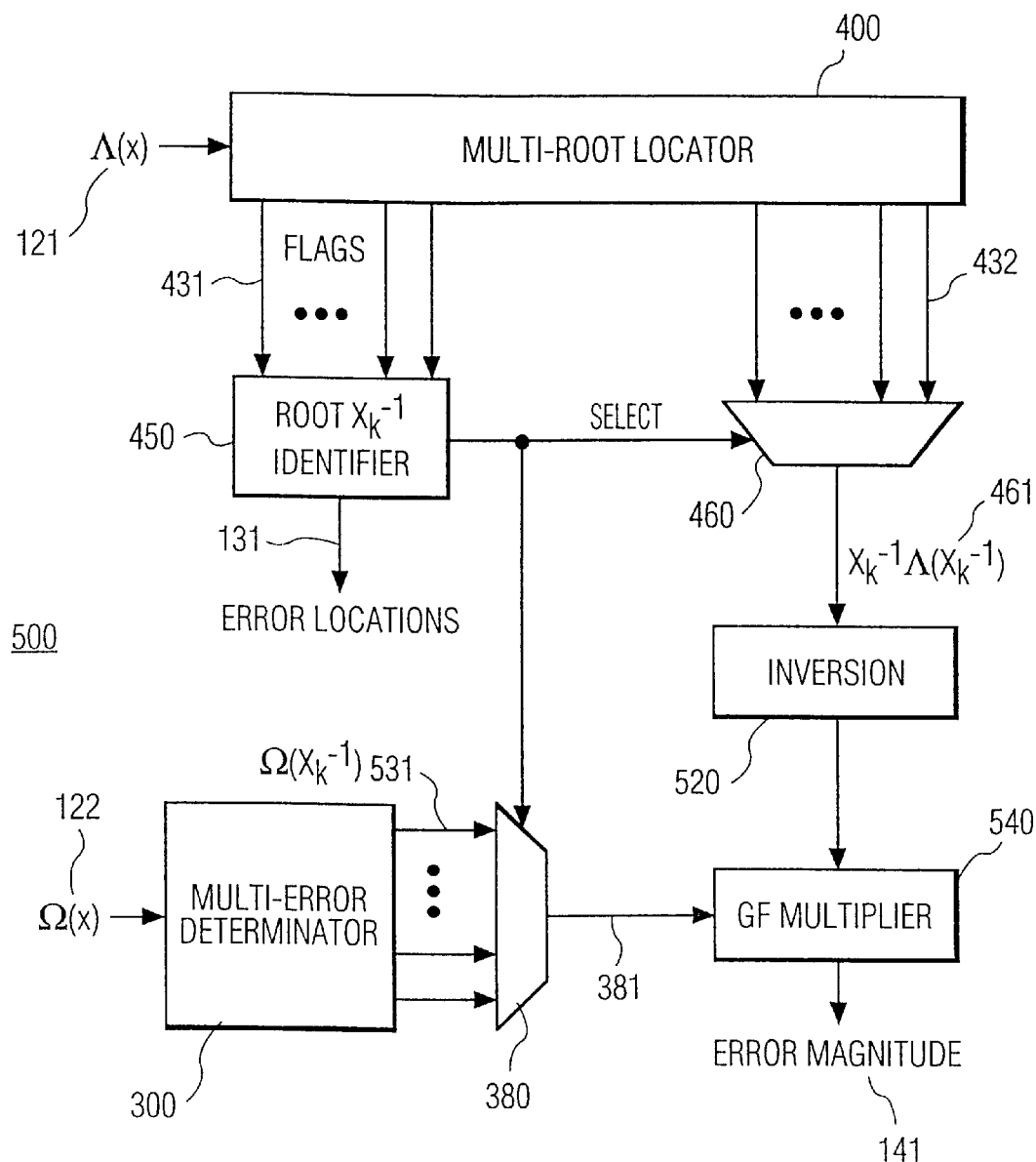
FIG. 5 illustrates an example block diagram of an error correcting decoder in accordance with this invention.

FIG. 5 illustrates an example block diagram of an error correcting decoder 500 that includes a locator 400 in accordance with this invention. The multi-root locator 400 receives the coefficients of an error locator polynomial $\Lambda(x)$ 121, for example from a Euclid's algorithm processor 120 as illustrated in FIG. 1. The multi-root locator 400 comprises a plurality of slice elements that each have m multipliers, thereby allowing for the simultaneous detection of up to m symbol errors in a received codeword r(x) corresponding to the error locator polynomial 121. The values 431 of the m simultaneous evaluations serve as error indicators, or flags, wherein a zero marks the location of an error. The root identifier 450 identifies each zero, $X_k^{-1}$, and provides each corresponding error location 131 to an error corrector, such as error corrector 150 in FIG. 1.

In this embodiment of the invention, if each of the m flags 431 are non-zero, the locator 400 is cycled to simultaneously provide the next set of m evaluations and corresponding m flags 431, as discussed above with regard to FIG. 4. In this manner, the time required to process received codewords r(x) that contain no errors is reduced by a factor of 1/m, compared to the prior art single error locator of FIGS. 1 and 2.

A preferred embodiment of the decoder 500 also includes a multi-error determinator 300, corresponding to the multi-value polynomial evaluator 300 of FIG. 3. This error determinator 300 receives the error magnitude polynomial $\Omega(x)$ 122 and simultaneously provides an evaluation of m error terms 531 (corresponding to terms 331, 341, etc. in FIG. 3) via a plurality of slice elements that each contains m coefficient multipliers. The determinator 300 is operated synchronously with the locator 400 so that the error terms $\Omega(X_k^{-1})$ 531 correspond to the same symbols identified by the locator flags 431 and corresponding derivative terms $X_k^{-1}\Lambda'(X_k^{-1})$ 432. Thus, at each cycle, the multi-root locator 400 and the multi-error determinator 300 provide an identification of up to m symbol errors, and corresponding error terms to facilitate the correction of each of these symbol errors.

The multi-root locator 400 and multi-error determinator 300 could provide their m multiple outputs to a system that corrects the m errors in the received codeword simultaneously. In a currently preferred embodiment, due primarily to circuit complexity and circuit area considerations, each identified error $X_k^{-1}$ is processed sequentially. The root identifier 450 identifies each zero-value flag 431, and provides the error location 131 and select signal 451 corresponding to each located error. The error locator 400 and determinator 300 are cycled to provide the next set of evaluations only after all the zero-value flags 431 are identified and processed.

Consistent with prior art processes, the error magnitude 141 is dependent upon the error term $\Omega(X_k^{-1})$ 531 that is provided by the error determinator 300 and an inverse of the derivative term $X_k^{-1}\Lambda'(X_k^{-1})$ 432 that is provided by the error locator 400. An inversion element 520 provides the inverse of the selected derivative term 461, and a GF (Galois Field) multiplier 540 provides the error magnitude 141 based on the inversion of the select derivative term 461 and the select error term 381. The error magnitude 141 is provided to an error corrector, such as the error corrector 150 of FIG. 1 to correct the symbol that is identified by the corresponding error location 131. After each of the identified errors is similarly corrected, the error locator 400 and determinator 300 are advanced to the next cycle to process the next set of m potential errors.

It should be noted that the choice of use of a multi-value polynomial evaluator 300 is substantially independent of the choice of use of the multi-root locator 400. That is, the multi-root locator 400 can be employed to identify each error, and then each identified error could be provided to a single-value error determinator, such as the error determinator 140 in FIG. 1. In this manner, the extra area required for a multi-value evaluator 300 can be avoided, while the increased speed of the multi-root locator 400 can be achieved, particularly when a low occurrence of errors is experienced.

The foregoing merely illustrates the principles of the invention, and not necessarily limited to the examples provided. For example, alternative algorithms, common in the art employ positive exponents of a, such that if an error is located at location p, $a^{n-p}$ will be a root of the error locator polynomial. Other applications also commonly utilize a sequential search for roots of polynomial, and could employ the techniques presented herein. It will thus be appreciated that those skilled in the art will be able to devise various arrangements which, although not explicitly described or shown herein, embody the principles of the invention and are thus within its spirit and scope of the following claims.

I claim:

1. A decoder comprising:
at least one polynomial evaluator that includes a plurality of slice elements,
   each slice element corresponding to a term of a polynomial,
   each slice element being configured to provide a plurality of term values corresponding to a plurality of argument values, and
   each slice element comprising a single register that is configured to receive a coefficient value corresponding to the term of the polynomial,
a plurality of adders that are configured to sum the plurality of term values corresponding to the plurality of argument values to provide a corresponding plurality of evaluation terms; and
an error corrector that is configured to provide a corrected codeword corresponding to a received codeword based on the plurality of evaluation terms corresponding to the plurality of argument values.

2. The decoder of claim 1, wherein
a first evaluator of the at least one polynomial evaluators is configured to provide a plurality of root indicators, and
wherein
   the polynomial corresponds to an error locator polynomial that is based on the received codeword,
   each indicator of the plurality of root indicators serves to identify a presence of a root of the error locator polynomial, and
   the error corrector is further configured to provide the corrected codeword based on the plurality of root indicators.

3. The decoder of claim 2, wherein
the first evaluator is further configured to simultaneously provide a plurality of error locations corresponding to the plurality of root indicators, and
the error corrector is further configured to provide the corrected codeword based on the plurality of error locations.

4. The decoder of claim 2, wherein
each indicator of the plurality of root indicators is based on a sum of a product term from a corresponding coefficient multiplier in each slice element of the plurality of slice elements.

5. The decoder of claim 1, wherein
each slice element of the plurality of slice elements further comprises:
   a plurality of coefficient multipliers that are each configured to multiple a content value of the single register by a corresponding factor to provide each term value of the plurality of term values.

6. The decoder of claim 5, wherein
the single register is configured to receive a select term value of the plurality of term values as the content value of the single register, and to provide this select term value to each of the plurality of coefficient multipliers at a next clock period.

7. The decoder of claim 1, further including
a second evaluator of the at least one polynomial evaluators that is configured to simultaneously provide a plurality of error magnitudes corresponding to the plurality of root indicators, and
wherein
   the error corrector is further configured to provide the corrected codeword based on the plurality of error magnitudes.

8. The decoder of claim 7, wherein
each error magnitude of the plurality of error magnitudes is based on a sum of a product term from a corresponding coefficient multiplier in each slice element of the plurality of slice elements in the second evaluator.

9. A decoder comprising:
a syndrome calculator that provides a plurality of syndromes corresponding to a received codeword,
a syndrome processor that provides an error locator polynomial and an error magnitude polynomial corresponding to the plurality of syndromes,
a multiple-error locator that simultaneously provides a plurality of error locations corresponding to roots of the error locator polynomial,
a multiple-error determinator that simultaneously provides a plurality of error terms based on the error magnitude polynomial corresponding to the plurality of error locations,
an error magnitude determinator that provides an error magnitude corresponding to each error term of the plurality of error terms and each error location of the plurality of error locations, and
an error corrector that receives the error magnitude corresponding to each error term, and each error location corresponding to the plurality of error locations, and provides therefrom a corrected codeword corresponding to the received codeword.

10. The decoder of claim 9, wherein
the multiple-error locator includes:
   a plurality of slice elements that are configured to operate simultaneously to provide the plurality of error locations,
   each slice element of the plurality of slice elements comprising:
      a plurality of coefficient multipliers, and
      a register that is configured to receive coefficients of the error locator polynomial and to store a product from a first multiplier of the plurality of coefficient multipliers at a first clock cycle period, and to provide this product to each of the plurality of coefficient multipliers at a next clock period, and
   a plurality of adders that are each configured to add a product term from a corresponding coefficient multiplier in the plurality of slice elements to provide therefrom a corresponding indicator of whether the corresponding error location is a root of the error locator polynomial.

11. The decoder of claim 9, wherein
the multiple-error determinator includes:
   a plurality of slice elements that are configured to operate simultaneously to provide the plurality of error terms,
   each slice element of the plurality of slice elements comprising:
      a plurality of coefficient multipliers, and
      a register that is configured to receive coefficients of the error magnitude polynomial and to store a product from a first multiplier of the plurality of coefficient multipliers at a first clock cycle period, and to provide this product to each of the plurality of coefficient multipliers at a next clock period, and a plurality of adders that are each configured to add a product term from a corresponding coefficient multiplier in the plurality of slice elements to provide therefrom each error term of the plurality of error terms.

12. A method for decoding a received codeword comprising:

providing an error locator polynomial based on the received codeword, simultaneously evaluating the error locator polynomial for a plurality of arguments to provide thereby an error location indicator corresponding to one or more determined roots of the error locator polynomial, and correcting an error in the received codeword corresponding to each determined root of the one or more determined roots;

wherein:
  simultaneously evaluating the error locator polynomial includes:
    simultaneously evaluating each term of the error locator polynomial for the plurality of arguments to form a product term corresponding to each term for each argument of the plurality of arguments, and
    summing each product term of each argument to form the error location indicator corresponding to each argument; and
  simultaneously evaluating each term includes:
    multiplying a factor corresponding to each of the plurality of arguments by a common coefficient to provide the plurality of product terms.

13. The method of claim 12, further including simultaneously evaluating an error magnitude polynomial for the plurality of arguments to provide thereby an error term corresponding to the one or more determined roots of the error locator polynomial, and wherein
  simultaneously evaluating the error magnitude polynomial includes:
    simultaneously evaluating each magnitude term of the error magnitude polynomial for the plurality of arguments to form a magnitude product term corresponding to each magnitude term for each argument of the plurality of arguments, and
    summing each magnitude product term of each argument to form the error term corresponding to each argument;
wherein
  simultaneously evaluating each magnitude term includes:
    multiplying an exponent factor corresponding to each of the plurality of arguments by a common magnitude coefficient to provide the plurality of magnitude product terms.

14. A method for simultaneously evaluating a polynomial for a plurality of arguments comprising:

simultaneously evaluating each term of the polynomial for the plurality of arguments to form a product term corresponding to each term for each argument of the plurality of arguments, and summing each product term of each argument to form a sum corresponding to the evaluation of the polynomial corresponding to each argument; and wherein
  simultaneously evaluating each term includes:
    multiplying a factor corresponding to each of the plurality of arguments by a common coefficient to provide the plurality of product terms.

* * * * *